US008723607B2

(12) United States Patent
Story et al.

(10) Patent No.: US 8,723,607 B2
(45) Date of Patent: May 13, 2014

(54) PHASE LOCKED LOOP

(75) Inventors: Michael Story, Whittlesford (GB);
Nicolas Sornin, La Tronche (FR)

(73) Assignee: Cambridge Silicon Radio Limited,
Cambridge (GB)

( * ) Notice: Subject to any disclaimer, the term of this patent is extended or adjusted under 35 U.S.C. 154(b) by 809 days.

(21) Appl. No.: 12/678,106

(22) PCT Filed: Aug. 19, 2008

(86) PCT No.: PCT/EP2008/060847
§ 371 (c)(1),
(2), (4) Date: Dec. 13, 2010

(87) PCT Pub. No.: WO2009/033918
PCT Pub. Date: Mar. 19, 2009

(65) Prior Publication Data
US 2010/0301961 A1    Dec. 2, 2010

(30) Foreign Application Priority Data

Sep. 13, 2007  (GB) .................................. 0717883.3

(51) Int. Cl.
*H03L 7/099*   (2006.01)
*H03J 7/04*    (2006.01)
*H03L 7/02*    (2006.01)

(52) U.S. Cl.
USPC ................ 331/1 R; 331/1 A; 331/16; 331/17;
331/25; 331/34; 331/74; 331/177 R; 327/156;
327/158; 327/159; 327/161

(58) Field of Classification Search
USPC ........ 331/1 A, 1 R, 16, 17, 34, 177 R, 74, 25;
327/156, 158, 159, 161
See application file for complete search history.

(56) References Cited

U.S. PATENT DOCUMENTS

| 7,279,988 B1 * | 10/2007 | Janesch et al. .................. 331/10 |
| 2007/0052463 A1 * | 3/2007 | Abel et al. ..................... 327/158 |
| 2007/0085579 A1 | 4/2007 | Wallberg et al. |

OTHER PUBLICATIONS

Examination Report under Section 18(3) corresponding to GB Patent Application No. GB0717883.3, dated Jul. 25, 2011.

* cited by examiner

*Primary Examiner* — Arnold Kinkead
*Assistant Examiner* — Richard Tan
(74) *Attorney, Agent, or Firm* — Sughrue Mion, PLLC

(57) ABSTRACT

A phase locked loop comprising: an oscillator for generating an output signal of a frequency that is dependent on an input to the oscillator; sampling means for generating a sequence of digital values representing the output of the oscillator at moments synchronized with a reference frequency; a difference unit for generating a feedback signal representing the difference between successive values in the sequence; and an integrator for integrating the difference between the feedback signal and a signal of a desired output frequency; the signal input to the oscillator being dependent on the output of the integrator.

19 Claims, 3 Drawing Sheets

PHASE LOCKED LOOP

CROSS REFERENCE TO RELATED APPLICATIONS

This application is a National Stage of International Application No. PCT/EP2008/060847 filed Aug. 19, 2008, claiming priority based on English Patent Application No. 0717883.3, filed Sep. 13, 2007, the contents of all of which are incorporated herein by reference in their entirety.

This invention relates to a phase locked loop. Embodiments of the phase locked loop can be implemented efficiently using digital components to provide at least some functions in the loop.

BACKGROUND OF THE INVENTION

Many transmitters, such as early Bluetooth on-chip transmitter designs, were based on a "Cartesian Loop" transmitter/receiver design. However, this design has a number of drawbacks due to the relatively high content of analogue circuitry that they contain. As silicon processes shrink and are further optimised for digital circuitry, these drawbacks increase.

A more recent transmitter design is the polar transmitter, as shown in FIG. 1. The input signals are encoded to produce two output signals, one ($\theta$) conveying frequency information and the other (r) conveying amplitude information. The frequency information signal is fed into a phase locked loop (PLL) which controls the generation of a signal of a corresponding frequency by an oscillator and the amplitude information signal is fed into an amplitude modulator (AM). The output of the oscillator is then amplitude modulated by the signal r.

The PLL typically consists of the following blocks

An oscillator whose frequency is controlled by a signal of some sort. The oscillator is typically a voltage controlled oscillator, whose output frequency is controlled by an input voltage.

A phase comparator, to compare the phase of the VCO output—perhaps after division—with an input reference frequency. If the phase of an output related signal is locked to a reference, its differential (its frequency) is ipso facto locked.

A loop filter. For the overall loop to be stable and usable, a loop filter is implemented.

In analogue PLLs the phase comparator is difficult to design so as to meet the desired tolerances whilst maintaining acceptable power consumption.

Particularly because of the way processes are optimised, it is attractive that both the PLL and the AM are implemented in digital form, and are controllable using digital input signals. However, it has proved difficult to implement digital forms of these components in practice.

A Texas Instruments digital PLL design ("All-digital Tx frequency synthesizer and discrete-time receiver for Bluetooth radio in 130-nm CMOS", Staszewski, Muhammad, Leipold, Hung Ho, Wallberg, Fernando, Maggio et al.) provides a VCO that is controlled by a digital word (a very wide digital word), and a phase detection system that achieves very fine phase resolution. However, this circuit is relatively complex.

There is therefore a need for a PLL that is more readily implemented and that has relatively low power consumption. Preferably such a PLL could be readily integrated with an amplitude modulator, so that the amplitude can be controlled using a digital input.

According to one aspect of the present invention there is provided a phase locked loop and an amplitude modulator as set out in the accompanying claims.

SUMMARY OF THE INVENTION

The present invention will now be described by way of example with reference to the accompanying drawings. In the drawings:

DETAILED DESCRIPTION OF THE EMBODIMENTS

Figure 2:
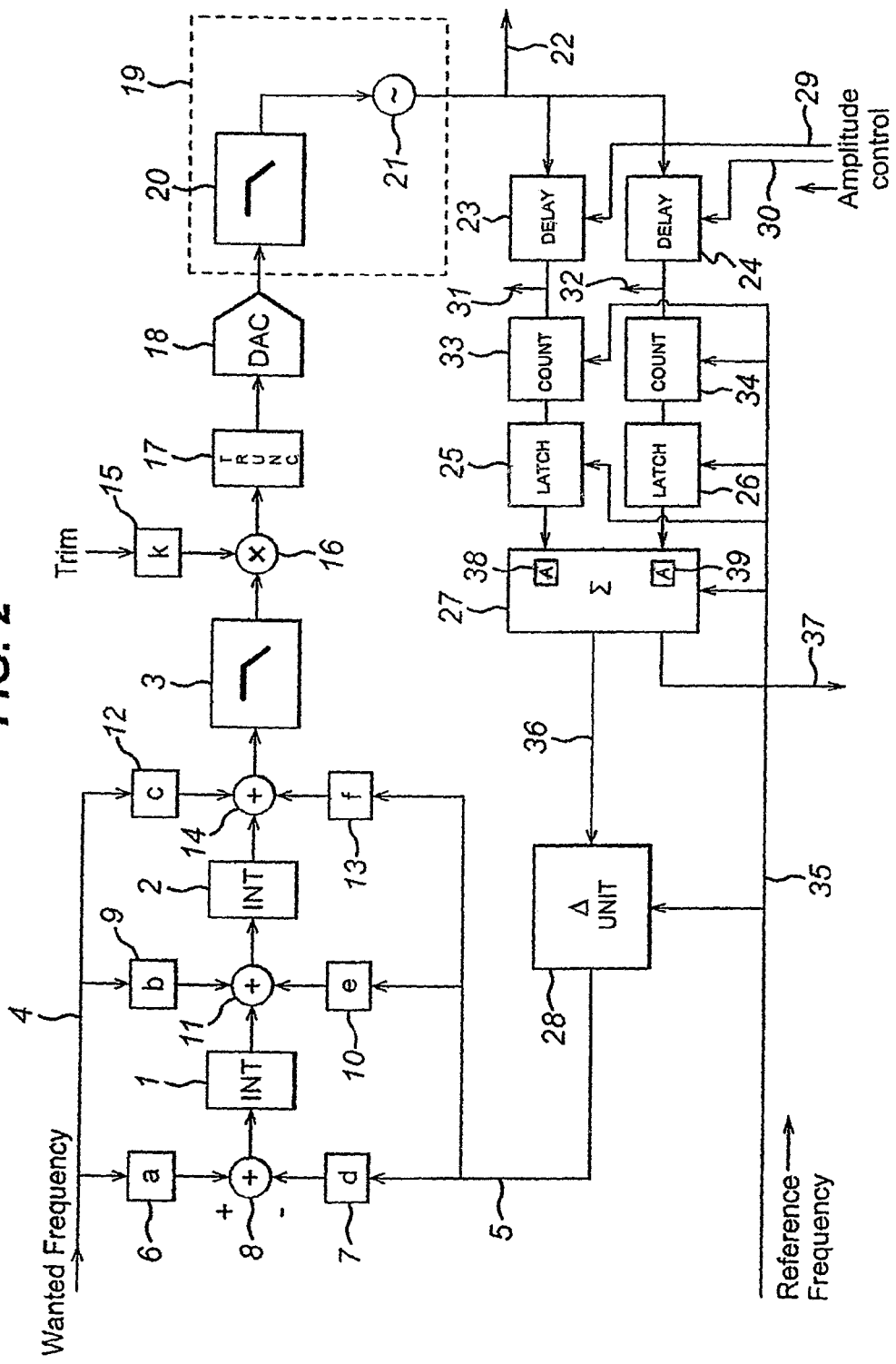
FIG. 2 shows a phase locked loop.

The loop shown in FIG. 2 comprises a series of integrators 1, 2 and a filter 3 which collectively perform in the digital domain functions equivalent to the phase detector, charge pump and loop filter of a conventional PLL. A signal at a wanted frequency is received at 4 and a loop feedback signal is provided at 5. These are weighted by selected values a and d in weighting units 6 and 7, and difference between the resulting signals is determined by a difference unit 8. The output of the difference unit is integrated by an integration unit 1, which acts as a second-order loop filter. The integration may be performed by having the integration unit output the value:

$$z^{-1}/(1-z^{-1})$$

where $z^{-1}$ represents the data word applied to the integration unit on the previous clock cycle. A summation unit 11 adds the output of the integrator 1 to two further inputs formed by weighting the signals at 4 and 5 by respective selected values b and e in weighting units 9 and 10. The output of the summation unit 11 is passed to a second integrator 2. The integrator 2 could apply the same function as the integrator 1. An effect of the second integrator is to provide loop gain. A second summation unit 14 adds the output of the integrator 2 to two further inputs formed by weighting the signals at 4 and 5 by respective selected values c and f in weighting units 12 and 13. The output of the summation unit 14 is filtered by a low-pass filter 3. The low-pass filtering may be performed by having the low-pass filter output the value:

$$\alpha/(1-(1-\alpha)z^{-1})$$

where $\alpha$ is a filter constant and $z^{-1}$ represents the data word applied to the filter unit on the previous clock cycle. An effect of the low-pass filter is to attenuate out-of-band information. The roll-off of the filter can be at around 4 times the desired bandwidth.

Since the loop filter is implemented in the digital domain it can cover a wide range of frequencies and can be programmable, for example in at least the range from mHz to MHz. Also, the filter can be implemented to perfectly reflect a desired response characteristic, without any variations due to manufacturing tolerances. These are significant advantages over PLLs in which the loop filter is implemented in the analogue domain.

The output of the filter 3 is multiplied in multiplication unit 16 with a signal of a selected value k representing a trimming signal for trimming the VCO 21.

The values a, b, c, d, e f, k and $\alpha$ are selected to provide the PLL with satisfactorily stable and effective characteristics, and can be determined using conventional theory. Some examples of suitable values for a, b, c, d and α with corresponding approximate loop bandwidths are as follows:

| alpha | a | b | c | d | e | approx loop BW (MHz) |
|---|---|---|---|---|---|---|
| 0.25 | 0.0062500 | 0.0491411 | 0.7311611 | −0.0062500 | −0.0833333 | 2 |
| 0.125 | 0.0015625 | 0.0245706 | 0.7311611 | −0.0015625 | −0.0416667 | 1 |
| 0.0625 | 0.0003906 | 0.0122853 | 0.7311611 | −0.0003906 | −0.0208333 | 0.5 |
| 0.03125 | 0.0000977 | 0.0061426 | 0.7311611 | −0.0000977 | −0.0104167 | 0.25 |
| 0.015625 | 0.0000244 | 0.0030713 | 0.7311611 | −0.0000244 | −0.0052083 | 0.125 |

The signals passing between units 1, 11, 2, 14, 3 and 16 are of a sufficient width to preserve enough information to maintain satisfactory operation of the loop. Due to the nature of the operations performed in these steps those signals will typically contain more bits than the input signals 4, 5. Around 20 bits has been found to be suitable. To simplify subsequent operations in the loop, the output of the multiplication unit 16 is truncated by a truncation unit 17 to reduce its bit length whilst retaining the most significant information in the signal. The truncation unit could simply discard the less significant bits of the signal, or could apply a more complex function. The output of the truncation unit could, for instance, be around 2 to 8 bits wide.

The output of the truncation unit is passed to a digital-to-analogue converter 18, which generates an output signal that is representative of its input. The output of the DAC is passed to a low-pass filter 20, which attenuates any extraneous high-frequency components. The roll-off of the filter 20 could be at around 8 times the loop bandwidth. The output of the filter 20 is passed to the control input of the VCO 21, so that the voltage level of the filter's output controls the operating frequency of the VCO. The VCO may include one or more dividers to achieve the desired output frequency from a core oscillator.

The components 20 and 21 operate in the analogue domain as indicated at 19. The remainder of the components of the PLL operate in the digital domain. It has been found that implementing all the stages of the PLL in the digital domain apart from the final control of the VCO, in this way, provides a particularly efficient implementation of a PLL.

Figure 1:
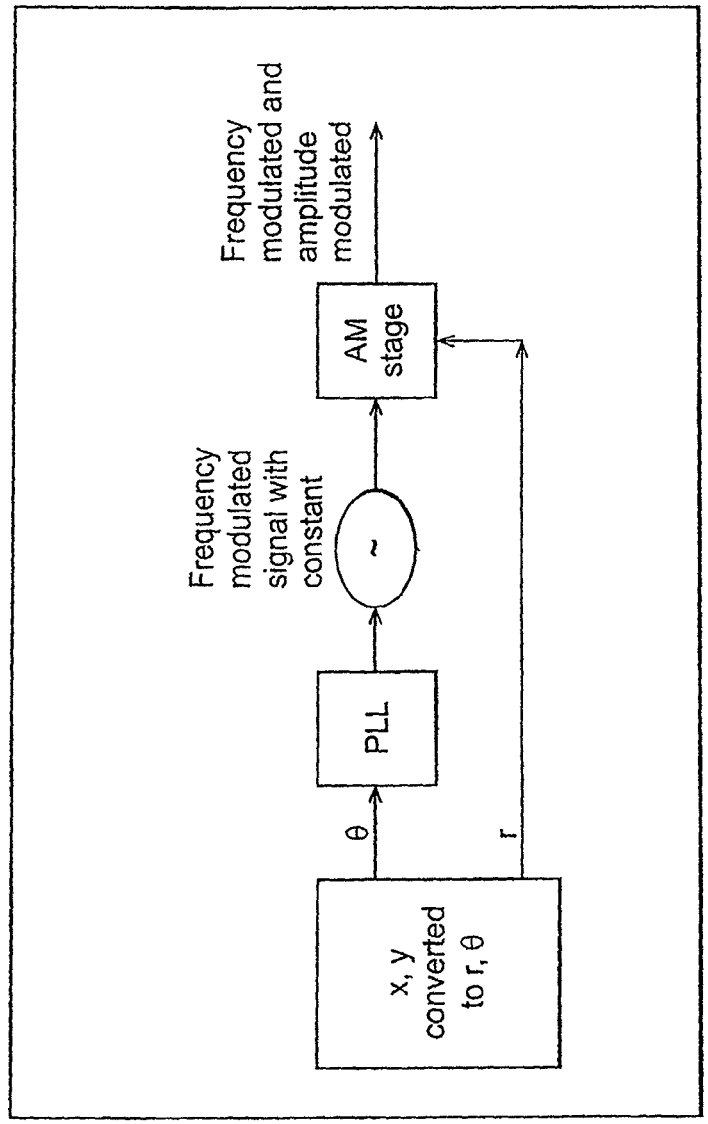
FIG. 1 shows a transmitter using polar modulation.

The output of the VCO could be used for any appropriate purpose. For example, it could be mixed with data signals that are to be transmitted in order to up-convert those signals, or with received data signals in order to down-convert them. In the present example the output of the VCO is used in a polar transmitter of the type shown generally in FIG. 1.

The output of the VCO is split and passes to two delay blocks 23 and 24 which apply a respective delay to the signal. The delay applied by each delay block is dependent on control signals 29, 30. In the polar transmitter design, the delay applied by block 23 relative to that applied by block 24 is used to set the output amplitude, as is described below. The relative delays are selected to cause the outputs to collectively represent the signal r illustrated in FIG. 1 when they are modulated. Outputs 31, 32 from the delay blocks pass to an amplitude modulation stage, which is described below with reference to FIG. 3. To achieve this, the delay blocks implement respective delays that are offset by equal but opposite amounts from two pre-set values in dependence on the desired amplitude, the amplitude modulation being achieved as the difference between the signals. For example, delay block 23 could implement a delay in the range from 110 to 290 ps, being 110 ps plus the currently set delay offset, and delay block 24 could implement a delay in the range from 290 to 110 ps, being 290 ps minus the currently set delay offset. The delay blocks could be implemented in the analogue domain.

The outputs of the delay blocks also pass to a frequency detection section implemented in the digital domain by blocks 25-28, 33 and 34. This performs a similar task to the phase detection system of a conventional PLL.

Each of the outputs from the delay blocks passes to a respective Gray coded counter 33, 34. These count up independently, clocked by a reference frequency received at 35. Thus, if the reference frequency is $f_1$ and the frequency of the VCO is $f_0$, the value held by of the counter will increase in each clock cycle by $(f_0/f_1)$, moderated by the delay applied in blocks 23 and 24. Thus, the value in each counter represents the phase offset between the reference frequency and the effective frequency of the VCO as input to the respective counter. In practice, the counter has a finite length so roll-over of the counter must also be accounted for. This is described in more detail below.

The values held in the counters are each sampled by respective latches 25, 26, the outputs of which are passed to a summation unit. The summation unit generates two outputs. A first output at 36 is formed as the sum of the inputs from latches 25 and 26. A second output at 37 is formed as the difference between the inputs from latches 25 and 26. The value of output 36 is used in the PLL. The value of output 37 is used as feedback for an amplitude control loop of the transmitter.

Output 36 passes to a difference unit 28. The difference unit 28 outputs a value representing the difference between the data words applied to it in successive clock cycles, i.e. the value:

$$z^0 - z^{-1}$$

where $z^0$ represents the input to the unit in the present clock cycle and $z^{-1}$ represents the input to the unit in the previous clock cycle.

The width of the data words passing between the units 23, 33, 25, 27, 24, 34, 26 and 28, and at the output of unit 28 can take any suitable size, but are preferably as small as possible whilst still achieving the required precision. They could, for example, be 2, 3 or 4 bits wide.

As discussed above, since the counters 33, 34 are clocked by the reference frequency, the values held by the counters will represent the offset between the phase of the signals output from the delay units and the reference frequency. When those are summed in summation unit 27 the effect of the delay units is in effect cancelled. When successive samples are subtracted from each other by difference unit 28 the output is dependent on the relative phase of the reference frequency and the VCO output frequency, but the output of the difference unit represents a frequency, rather than a phase as would be the case at the analogous point in a conventional PLL. This frequency forms the feedback frequency signal at 5. By integrating that signal as described above, the phase data is recovered.

As indicated above, the counters 23 and 24 are of finite length and will therefore roll over when they reach their maximum values. This needs to be accommodated by the system. A convenient way to do so is by means of analysis units 38, 39. These monitor the inputs from the respective latches and detect from those inputs when the counters have rolled over. Provided the counter is of a length greater than the maximum count increment in a particular clock cycle due to a phase disparity roll-over can be detected by the latch outputs moving from the upper end of their range to the lower end of their range between two clock cycles. When that is detected the analysis unit(s) signal(s) the difference unit 28 to treat the sample on which rollover has occurred differently when comparing it with the preceding sample than when comparing with the succeeding sample. This may be implemented by means of a look-up table in the difference unit 28. It should be noted that the difference unit runs at the reference frequency, not the frequency of the VCO, allowing it to use less power in a typical implementation if the reference frequency is lower than that of the VCO.

The circuit can be further simplified by eliminating the counters 33, 34 (and hence the analysis units 38, 39) and having the latches simply sample the outputs from the delay units 23, 24. Provided the range over which the frequency of the VCO can vary is within the resolution obtainable by simply comparing successive samples from the latches, this method achieves equivalent results with a relatively simple circuit, saving power and circuit area.

Due to the way in which the reference signal 35 and the output of the VCO are compared, the reference signal need not have the same frequency as the VCO: indeed, it could be of an unrelated frequency. For example, the reference signal could be around 200 MHz when the VCO is operating at around 2.5 GHz. This makes the implementation of the circuit especially convenient. Since there is no need to provide a reference frequency of a particular value, a suitable signal that may exist elsewhere in the circuit could be used to provide the reference frequency. Since the reference frequency can be selected to be relatively low, the power consumption of the frequency detection circuitry can be kept relatively low. The reference frequency could even be modulated provided the modulation is known, since it can then be accounted for digitally in the frequency detection section.

Figure 3:
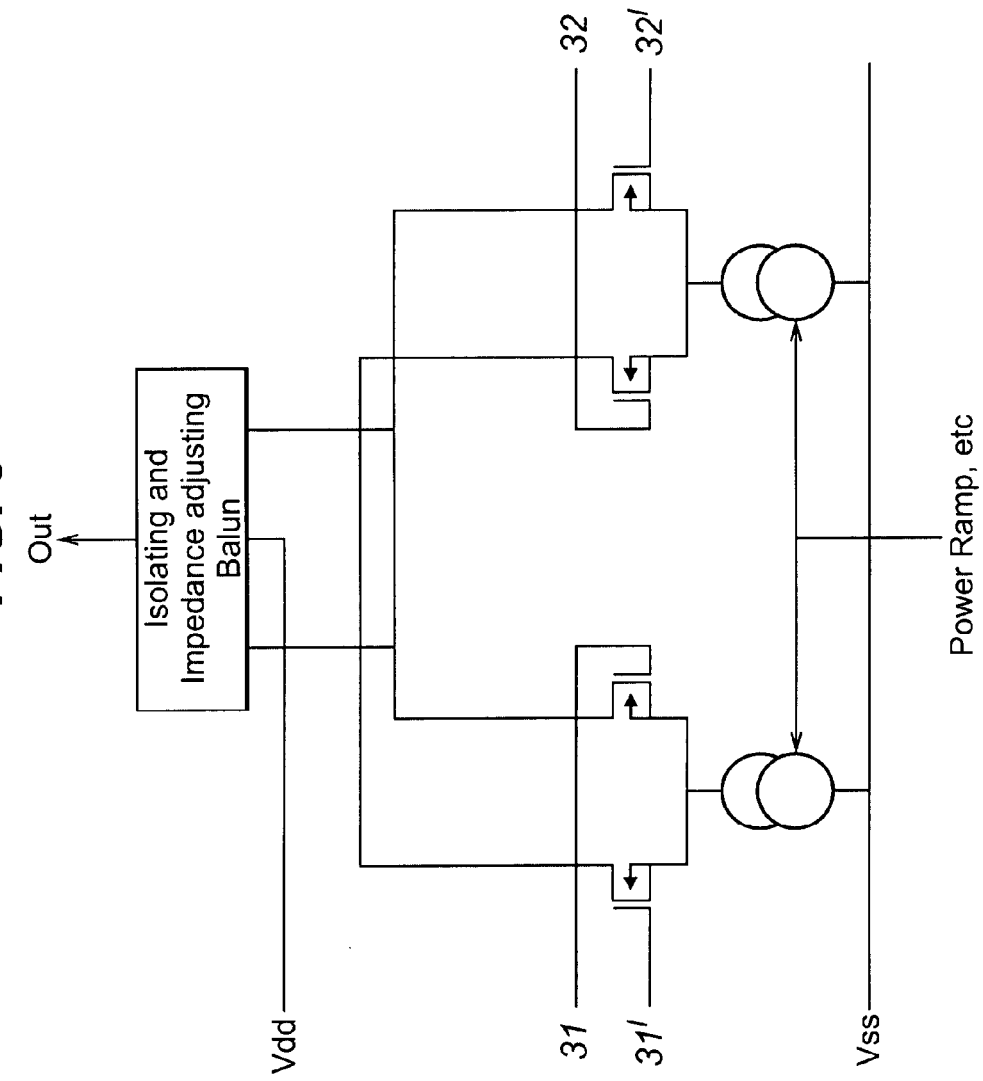
FIG. 3 shows an amplitude modulator.

FIG. 3 shows a modulation stage that can be used for amplitude modulating the outputs 31, 32. One pair of transistor amplifiers receives signal 31 and its inverse, 31'. Another pair of transistor amplifiers receives signal 32 and its inverse 32'. These are combined in a balun and output, for example to an antenna for transmission.

The oscillator could operate in the digital domain, in which case there would be no need to convert its output to the digital domain for use in the frequency detection section. However, if the oscillator is an analogue oscillator then its output is converted to the digital domain, conveniently after the delay units 23, 24.

The oscillator could be controlled other than by voltage, with appropriate variation of its input signal.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The invention claimed is:

1. A phase locked loop comprising:
   an oscillator for generating an output signal of a frequency that is dependent on an input signal to the oscillator;
   a delay unit for forming a first delayed version of the output signal of the oscillator;
   sampling means for generating a sequence of digital values representing the output signal of the oscillator at moments synchronised with a reference frequency;
   a difference unit for generating a feedback signal representing a difference between successive values in the sequence; and
   a first integrator for integrating a difference between the feedback signal and a signal of a desired output frequency;
   the input signal to the oscillator being dependent on an output of the first integrator,
   and
   wherein the sampling means generates the sequence of digital values as a sum of the output signal of the oscillator and the first delayed version of the output signal of the oscillator.

2. The phase locked loop as claimed in claim 1, wherein each digital value of the sequence of digital values generated by the sampling means is a sum of a sample of the output signal of the oscillator and a sample of the first delayed version of the output signal of the oscillator.

3. The phase locked loop as claimed in claim 1, wherein each digital value of the sequence of digital values generated by the sampling means is derived from a count of one or more counters that count samples of at least one of the output signal of the oscillator and the first delayed version of the output signal of the oscillator.

4. The phase locked loop as claimed in claim 1, wherein the reference frequency is substantially different from the frequency of the output signal of the oscillator.

5. The phase locked loop as claimed in claim 1, wherein the reference frequency is lower than the frequency of the output signal of the oscillator.

6. The phase locked loop as claimed in claim 1, wherein the frequency of the output frequency signal of the oscillator is not an integer multiple of the reference frequency.

7. The phase locked loop as claimed in claim 1, wherein the difference between the feedback signal and the signal of the desired output frequency is a weighted difference.

8. The phase locked loop as claimed in claim 1, wherein the integration step is performed in a digital domain and the phase locked loop comprises a digital to analogue converter for converting to an analogue domain a signal dependent on the output of the first integrator so as to form the input signal to the oscillator.

9. An amplitude modulator comprising:
   the phase locked loop as claimed in claim 1; and
   modulation means for forming a modulated output signal in dependence on the first delayed version of the output signal of the oscillator and the output signal of the oscillator.

10. The amplitude modulator as claimed in claim 9, wherein the modulation means is arranged to form the modulated output signal as a linear combination of the first delayed version of the output signal of the oscillator and the output signal of the oscillator.

11. The phase locked loop as claimed in claim 1, wherein the phase locked loop further comprises a second integrator for integrating a sum of the output of the first integrator, the signal of the desired output frequency and the feedback signal.

12. A phase locked loop comprising:
an oscillator for generating an output signal of a frequency that is dependent on an input signal to the oscillator;
a first delay unit for forming a first delayed version of the output signal of the oscillator;
a second delay unit for forming a second delayed version of the output signal of the oscillator;
sampling means for generating a sequence of digital values representing the output signal of the oscillator at moments synchronised with a reference frequency;
a difference unit for generating a feedback signal representing a difference between successive values in the sequence; and
a first integrator for integrating a difference between the feedback signal and a signal of a desired output frequency;
the input signal to the oscillator being dependent on an output of the first integrator,
and wherein the sampling means generates the sequence of digital values as a sum of the first and second delayed versions of the output signal of the oscillator.

13. An amplitude modulator comprising:
the phase locked loop as claimed in claim 12; and
modulation means for forming a modulated output signal in dependence on the first delayed version of the output signal of the oscillator and the second delayed version of the output signal of the oscillator.

14. The amplitude modulator as claimed in claim 13, wherein the modulation means is arranged to form the modulated output signal as a linear combination of the first delayed version of the output signal of the oscillator and the second delayed version of the output signal of the oscillator.

15. The phase locked loop as claimed in claim 12, wherein each of the digital values generated by the sampling means is a sum of samples of the first and second delayed versions of the output signal of the oscillator.

16. The phase locked loop as claimed in claim 12, wherein the integration step is performed in a digital domain and the phase locked loop comprises a digital to analogue converter for converting to an analogue domain a signal dependent on the output of the first integrator so as to form the input signal to the oscillator.

17. A phase locked loop comprising:
an oscillator for generating an output signal of a frequency that is dependent on an input signal to the oscillator;
sampling means for generating a sequence of digital values representing the output signal of the oscillator at moments synchronised with a reference frequency;
a difference unit for generating a feedback signal representing a difference between successive values in the sequence; and
a first integrator for integrating a difference between the feedback signal and a signal of a desired output frequency;
wherein the input signal to the oscillator is dependent on an output of the first integrator, and
wherein the phase locked loop further comprises a second integrator for integrating a sum of the output of the first integrator, the signal of the desired output frequency and the feedback signal.

18. The phase locked loop as claimed in claim 17, wherein the sum of the output of the first integrator, the signal of the desired output frequency and the feedback signal is a weighted sum.

19. The phase locked loop as claimed in claim 17, wherein the integration step is performed in a digital domain and the phase locked loop comprises a digital to analogue converter for converting to an analogue domain a signal dependent on the output of the first integrator so as to form the input signal to the oscillator.

* * * * *